(12) United States Patent
Flamm et al.

(10) Patent No.: US 11,817,794 B2
(45) Date of Patent: Nov. 14, 2023

(54) ELECTRONIC CIRCUIT MODULE

(71) Applicant: Robert Bosch GmbH, Stuttgart (DE)

(72) Inventors: Gunter Flamm, Sonnenbuehl (DE);
Reiner Schuetz, Ditzingen (DE);
Wolfram Kienle, Magstadt (DE)

(73) Assignee: Robert Bosch GmbH, Stuttgart (DE)

( * ) Notice: Subject to any disclaimer, the term of this patent is extended or adjusted under 35 U.S.C. 154(b) by 295 days.

(21) Appl. No.: 17/601,462

(22) PCT Filed: Mar. 25, 2020

(86) PCT No.: PCT/EP2020/058282
§ 371 (c)(1),
(2) Date: Oct. 5, 2021

(87) PCT Pub. No.: WO2020/200946
PCT Pub. Date: Oct. 8, 2020

(65) Prior Publication Data
US 2022/0200468 A1 Jun. 23, 2022

(30) Foreign Application Priority Data
Mar. 25, 2020 (DE) .................... 10 2019 204 889.7

(51) Int. Cl.
*H02M 7/00* (2006.01)
*H02M 7/48* (2007.01)

(52) U.S. Cl.
CPC ............. *H02M 7/003* (2013.01); *H02M 7/48* (2013.01)

(58) Field of Classification Search
CPC ................................. H02M 7/003; H02M 7/48
See application file for complete search history.

(56) References Cited

U.S. PATENT DOCUMENTS

2007/0109715 A1 5/2007 Azuma et al.
2011/0155414 A1* 6/2011 Yasukawa ............. H02M 7/003
174/68.2

(Continued)

OTHER PUBLICATIONS

Translation of International Search Report for Application No. PCT/EP2020/058282 dated Jun. 25, 2020 (2 pages).

*Primary Examiner* — Jue Zhang
(74) *Attorney, Agent, or Firm* — Michael Best & Friedrich LLP

(57) ABSTRACT

For an electronic circuit module (1), more particularly a circuit module that is used as an inverter for an electrical machine or as a converter, comprising at least one electronics unit (4), more particularly a power electronics unit, wherein the electronics unit (4) comprises at least one carrier substrate (5) and at least one electrical and/or electronic component (32) provided on the carrier substrate (5), at least one first connection point (10) and at least two second connection points (20) are formed on the carrier substrate (5) on a substrate top side (7) of the carrier substrate (5), the first connection point (10) is provided between the two second connection points (20), and wherein the electronic circuit module (1) further comprises at least one electrical or electronic part (8) having at least one first bus bar (12) for electrically contacting the electronic part (8) and at least one second bus bar (22) for electrically contacting the electronic part (8), the invention proposes that an electrically conductive bridge element (40) electrically conductively interconnects the two second connection points (20), the bridge element (40) passing, bridge-like, over the first connection point (10) and being spaced apart from the first connection point by means of a gap and electrically isolated, the first connection point (10) being electrically conductively connected to the first bus bar (12) by first connection elements (11) and the second connection point being electrically (Continued)

conductively connected to the second bus bar (22) by second connection elements (21).

12 Claims, 3 Drawing Sheets

(56) References Cited

U.S. PATENT DOCUMENTS

| | | | |
|---|---|---|---|
| 2013/0016548 A1* | 1/2013 | Seki | H01L 23/36 |
| | | | 363/131 |
| 2013/0093046 A1 | 4/2013 | Bayerer et al. | |
| 2015/0029666 A1* | 1/2015 | Kosuga | B60L 50/51 |
| | | | 361/699 |
| 2021/0305147 A1* | 9/2021 | Iguchi | H01L 23/041 |

* cited by examiner

ELECTRONIC CIRCUIT MODULE

BACKGROUND

The invention relates to an electronic circuit unit, in particular to a circuit unit that serves as an inverter for an electrical machine or as a converter.

Inverter structures and converter structures with commutating circuits comprising DC link capacitors and half-bridges, which are formed in power modules for example, are used in hybrid vehicles or electric vehicles. For example, for operating an electrical machine, inverters which provide phase currents for the electrical machine are used. The inverters and converters comprise for example power modules and at least one DC link capacitor which provides the electrical energy for a short time. The power modules may comprise for example a carrier substrate with interconnects, power semiconductors, which form an electronics assembly together with the carrier substrate, being arranged on said carrier substrate for example. It is known that connection contacts of the DC link capacitor are electrically conductively connected to the power modules. For this purpose, contact elements which are guided out of the power module and electrically contact the electronics assembly are connected to the connection contacts of the DC link capacitor. The electronics assembly may be encapsulated by an electrically insulating compound, out of which the contact elements which electrically contact the electronics assembly are guided and, outside the electrically insulating compound, are connected to the connection elements.

U.S. 2007 0109715 A1 shows such a DC link capacitor which is electrically conductively connected to power modules. In this case, the electronics assemblies of the power modules are arranged in racks, and contact elements which electrically contact the electronics assembly are, for further contacting, guided out from the rack and then screwed to the connection contacts of the DC link capacitor and in this way make electrically conductive contact.

SUMMARY

The invention proposes an electronic circuit unit, in particular a circuit unit which serves as an inverter for an electrical machine or as a converter. The electronic circuit unit comprises at least one electronics unit, in particular a power electronics unit, wherein the electronics unit comprises at least one carrier substrate and at least one electrical and/or electronic component arranged on the carrier substrate, wherein at least one first connection point and at least two second connection points are formed on the carrier substrate on a substrate top side of the carrier substrate, wherein the first connection point is arranged between the two second connection points, wherein the electronic circuit unit further comprises at least one electrical or electronic device with at least one first conductor bar for electrically contacting the electronic device and at least one second conductor bar for electrically contacting the electronic device. According to the invention, an electrically conductive bridge element electrically conductively connects the two second connection points to one another, wherein the bridge element is guided across the first connection point in the manner of a bridge and is spaced apart and electrically insulated from said first connection point by an intermediate space, wherein the first connection point is electrically conductively connected to the first conductor bar by first connecting elements and the second connection point is electrically conductively connected to the second conductor bar by second connecting elements.

Advantages of the invention

The electronic circuit unit having the features of the independent claim has the advantage over the prior art that, in the case of the electronic circuit unit, the inductance in the region in which the conductor bars of the electronic device are electrically conductively connected to the electronics unit by the connecting elements is greatly reduced. This is achieved by way of the two second connection points on the carrier substrate being electrically conductively connected by the bridge element. Even though the carrier substrate, for example a DBC substrate (direct bonded copper), is of single-layer structure and the first connection point is arranged between the two second connection points on the carrier substrate, the two second connection points may nevertheless also be electrically conductively contacted by the second connecting elements in the region between the two second connection points by way of bridging the first connection point. Therefore, more T+/T− contact pairs of connecting elements may establish the electrically conductive contact between the conductor bars and the connection points of the carrier substrate than in the prior art. Here, a T+/T− contact pair indicates a pair of in each case one first connecting element and one second connecting element. The first connecting element and the second connecting element carry current in opposite directions. By way of the bridge element, a large number of pairs comprising in each case one first connecting element and in each case one second connecting element may be formed for connecting the conductor bars to the connection points. Therefore, the inductance in the electronic circuit unit may be reduced and consequently faster switching of the semiconductor switches in the electronic circuit unit may be achieved.

According to one advantageous exemplary embodiment, it is provided that the first connecting elements are designed as ribbon bonds and/or wire bonds and/or the second connecting elements are designed as ribbon bonds and/or as wire bonds. Owing to the use of ribbon bonds or wire bonds as connecting elements, the conductor bars may be connected to the connection points of the substrate in an advantageously effective and simple manner and a large number of pairs of connecting elements may be used for connection purposes. Owing to the high number of pairs of connecting elements, the inductance in the region of the connection between the conductor bars and the connection points of the substrate is advantageously reduced.

According to one advantageous exemplary embodiment, it is provided that the first connecting elements and the second connecting elements are arranged alternately. Owing to this alternating arrangement of first and second connecting elements, first connecting elements are arranged for example between two second connecting elements and/or conversely second connecting elements are arranged between two first connecting elements. Therefore, in addition to the reduction in the inductance owing to the individual pairs of connecting elements, the pairs may also interact with one another and the inductance of the connection between the conductor bars and the connection points of the substrate may be further reduced.

According to one advantageous exemplary embodiment, it is provided that the first connecting elements and the second connecting elements are arranged parallel in relation to one another. Owing to a parallel arrangement, the current paths in the connecting elements run parallel in relation to one another and those in the first connecting elements and the second connecting elements run in opposite directions and parallel in relation to one another. As a result, the inductance of the connection between the conductor bars and the connection points of the substrate is further reduced owing to the connecting elements.

According to one advantageous exemplary embodiment, it is provided that the first connection point extends in a planar manner in a direction of extent on the carrier substrate between the two second connection points. Here, the first connection point extends for example parallel in relation to the bridge element. Therefore, the connecting elements may be electrically conductively contacted in pairs and/or alternately over the entire extent of the first connection point and of the bridge element.

According to one advantageous exemplary embodiment, it is provided that the points at which the first connecting elements are in electrically conductive contact with the first connection point are arranged next to one another along the direction of extent.

According to one advantageous exemplary embodiment, it is provided that the points at which the second connecting elements are electrically conductively connected to the bridge element are arranged next to one another along a direction of extent of the bridge element.

According to one advantageous exemplary embodiment, it is provided that the first connecting elements along the first conductor bar are in electrically conductive contact with the first conductor bar and/or the second connecting elements along the second conductor bar are in electrically conductive contact with the second conductor bar.

According to one advantageous exemplary embodiment, it is provided that the bridge element is designed as a metal strip. The bridge element is therefore highly electrically conductive and may advantageously be readily shaped, processed and contacted.

According to one advantageous exemplary embodiment, it is provided that an electrically insulating spacer element is arranged in the intermediate space between the bridge element and the first connection point. The electrically insulating spacer element separates the electrically conductive bridge element from the first connection point and insulates it from the first connection point. At the same time, the spacer element may establish thermal contact between the bridge element and the carrier substrate and heat may be dissipated from the bridge element, via the carrier substrate, to a heat sink for example.

BRIEF DESCRIPTION OF THE DRAWINGS

An exemplary embodiment of the invention is explained in more detail in the description that follows and is illustrated in the drawing, in which.

DETAILED DESCRIPTION

The electronic circuit unit according to the invention may have a wide variety of applications, for example as an inverter or a converter in automotive engineering. For example, the electronic circuit unit may also be used as an inverter, referred to as a power inverter, for operating an electrical machine, for example of hybrid or electric vehicles.

Figure 1:
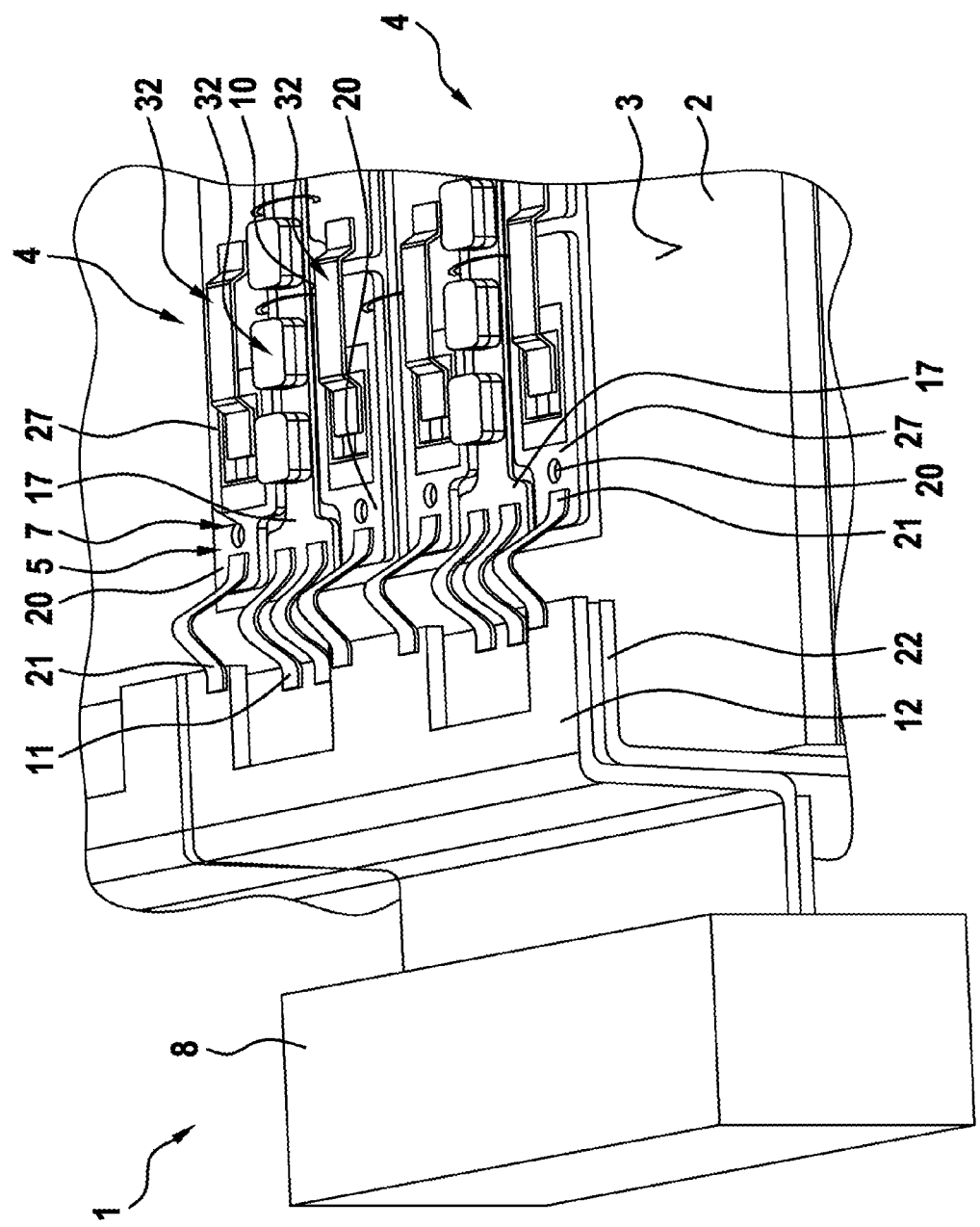
FIG. 1 shows an illustration of an electronic circuit unit from the prior art.
Figure 2:
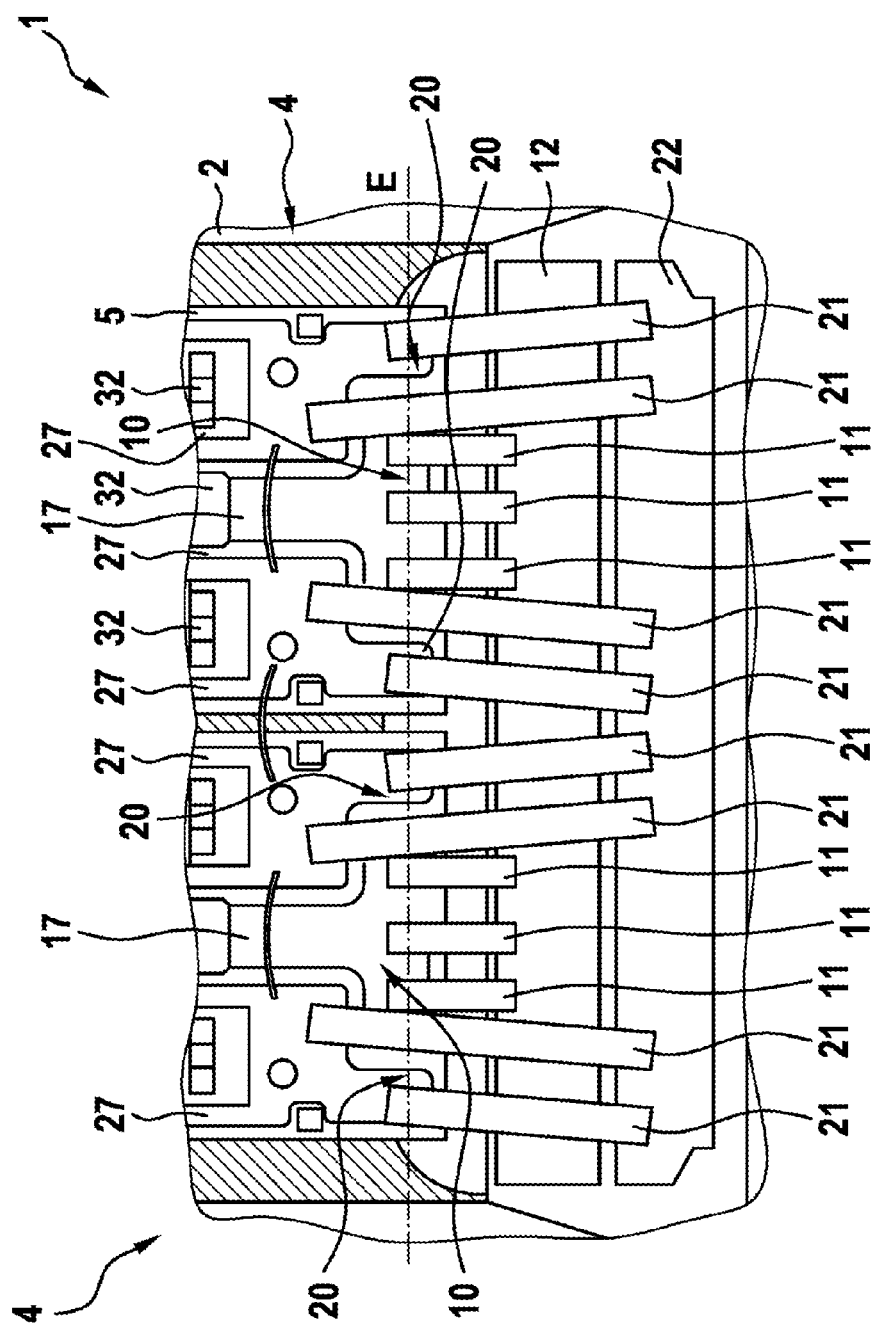
FIG. 2 shows a plan view of an electronic circuit unit from the prior art.

FIG. 1 and FIG. 2 show exemplary embodiments of electronic circuit units 1 from the prior art. The circuit unit 1 comprises an electronics unit 4, in particular a power electronics unit, wherein the electronics unit 4 comprises a carrier substrate 5 and electrical and/or electronic components 32 arranged on the carrier substrate 5. The carrier substrate 5 may comprise a number of layers of electrically conductive materials such as metals and/or dielectric materials. The carrier substrate 5 is, for example, a circuit carrier, in this exemplary embodiment a DBC substrate (Direct Bonded Copper). However, the carrier substrate 5 may also be for example an AMB substrate (Active Metal Brazed), an IMS (Insulated Metal Substrate), a printed circuit board (PCB) or some other substrate that is suitable for power modules. Various electrical and/or electronic components 32, such as for example power semiconductors, such as for example field-effect transistors such as MIS-FETs (Metal Insulated Semiconductor Field-Effect Transistor), IGBTs (insulated-gate bipolar transistor), power MOSFETs (metal oxide semiconductor field-effect transistor) and/or diodes, for example rectifier diodes, may be arranged on a substrate top side 7 of the carrier substrate 5. Said power semiconductors may be, for example, unpackaged power semiconductors (bare dies). Furthermore, passive components, such as for example resistors or capacitors, may also be arranged on the carrier substrate 5 as electrical and/or electronic components 32.

The carrier substrate 5 may furthermore comprise interconnects 17, 27. The electrical and/or electronic components 32 may be electrically conductively connected to one another or to further electrical and/or electronic elements arranged outside the electronics unit 4 and not illustrated in the figures, for example via the interconnects 17, 27 of the carrier substrate 5, via bonding wires or other suitable electrically conductive contact elements, for example by soldering or sintering. The interconnects 17, 27 may be designed as conductor areas, as in this exemplary embodiment. At least one first connection point 10, at which a first interconnect 17 may be electrically contacted, is formed on the substrate top side 7 of the carrier substrate 5. Furthermore, at least two second connection points 20, at which second interconnects 27 may be electrically conductively contacted, are formed on the substrate top side 7 of the carrier substrate 5. The electronics unit 4 may be electrically conductively connected to elements arranged outside the electronics unit 4 at the connection points. Here, a first connection point 10 has for example a polarity opposite to that of the second connection point 20 and designated T−, with the polarity of the second connection point 20 being designated T+.

As illustrated in the figures, an electronics unit 4 comprises a first connection point 10 and two second connection points 20 on the carrier substrate. The first connection point 10 is at least partially arranged between the two connection points 20 and separates the second connection points 20 from one another. The two connection points 20 have the same polarity T+. The connection point 10 arranged between the connection points 20 has the opposite polarity T−. The connection point 10 indicates for example a region of the first interconnect 17 in which the interconnect 17 may be electrically conductively contacted. The connection points 20 indicate for example regions of the second interconnect 27 or of the second interconnects 27 in which the interconnect 27 may be electrically conductively contacted.

In this exemplary embodiment, the carrier substrate 5 of the electronics unit 4 is arranged on a top side 3 of a heat sink 2 and is soldered for example to the top side 3 of the heat sink 2. The carrier substrate 5 may rest on the heat sink 2 directly or with the interposition of a thermally conductive layer. The heat sink 2 serves to dissipate heat generated in the electronics unit 4 and is distinguished by high thermal conductivity. The heat sink 2 is manufactured from a material with good thermal conductivity, such as aluminum or copper for example. In this exemplary embodiment, the heat sink 2 is manufactured from copper and designed as a plate. Structures, not illustrated in the figures, for improving the dissipation of heat, such as fins, pins or ducts for example, may also be formed on the heat sink 2 for example. The carrier substrate 5 of the electronics unit 4 may for example also rest directly on the top side 3 of the heat sink 2 and be insulated from the heat sink 2 for example by an electrically insulating layer comprised by the carrier substrate 5.

Furthermore, as illustrated in FIG. 1, the electronic circuit unit 1 comprises at least one electrical and/or electronic device 8, which is not comprised by the electronics unit 4. In the exemplary embodiment described in the present application, the electrical and/or electronic device 8 is a capacitor. It may for example be a power capacitor, which serves for example as a DC link capacitor of the electronic circuit unit 1. Such a capacitor may also comprise a number of capacitor elements that are electrically conductively connected to one another, themselves form individual capacitances and for example also comprise the electrically conductive connecting elements that are necessary for electrically conductively connecting these capacitor elements. Various capacitor technologies, such as for example film capacitors, such as stacked or cylindrically wound capacitors, or other suitable capacitor technologies may be used here as the capacitor or as the capacitor elements.

In the exemplary embodiment, the capacitor, as an electrical and/or electronic device 8, comprises two conductor bars 12, 22. In the context of the present application, a conductor bar 12, 22 of the electrical and/or electronic device 8 is understood as meaning an electrically conductive and one-piece device that extends or protrudes from the electrical and/or electronic device 8 and is provided for electrically contacting the electrical and/or electronic device 8 with electrical and/or electronic elements arranged outside the electrical and/or electronic device 8. Therefore, in this exemplary embodiment, two conductor bars 12, 22, which are provided for electrically contacting the two electrodes of the capacitor 8 with electrical and/or electronic elements arranged outside the capacitor 8, such as in particular of the electronics unit 4, protrude from the capacitor as an electrical and/or electronic device 8. The conductor bars 12, 22 may be at least partially manufactured from one or more metals, such as for instance copper or aluminum, and for example be partially insulated or else not insulated. They may for example be produced from metal sheets. In the present application, a distinction is drawn between a first conductor bar 12 and a second conductor bar 22, where the first conductor bar 12 represents a connection contact which, as in the exemplary embodiment with a capacitor as the electrical and/or electronic device 8, extends from a first of the two electrodes of a capacitor and the second conductor bar 22 represents a connection contact which extends from a second of the two electrodes of the capacitor. In the figures, conductor bars 12, 22, a first conductor bar 12 and a second conductor bar 22, are represented by way of example. However, a number of first and/or second conductor bars 12, 22 may also be formed, and for example also be electrically conductively connected to further connection points formed on further electronics units 4 not illustrated in the figures. In addition, the electrical and/or electronic device 8 may for example also be electrically conductively connected to other elements not illustrated in the figures, such as for example further electrical and/or electronic devices 8, via other electrical contacts not illustrated in the figures.

As illustrated in FIG. 1, the first conductor bar 12 is of planar design and the second conductor bar 22 is of planar design in the electronic circuit unit 1. In the context of the present application, a conductor bar 12, 22 is understood as meaning an electrically conductive planar conductor, for example an electrically conductive bar or an electrically conductive strip. A conductor bar 12, 22 may consequently be a busbar for example. The conductor bars 12, 22 may for example be bent or curved or else run in a curved or step-like manner. The conductor bars 12, 22 may largely overlap here and for example also be routed such that they are at least partially plane-parallel in relation to one another, in order to make it possible for the current to be conducted with as low an inductance as possible. The conductor bars 12, 22 may for this purpose preferably also be routed such that they are parallel in relation to one another at least in regions and for example may also be of the same width.

Figure 3:
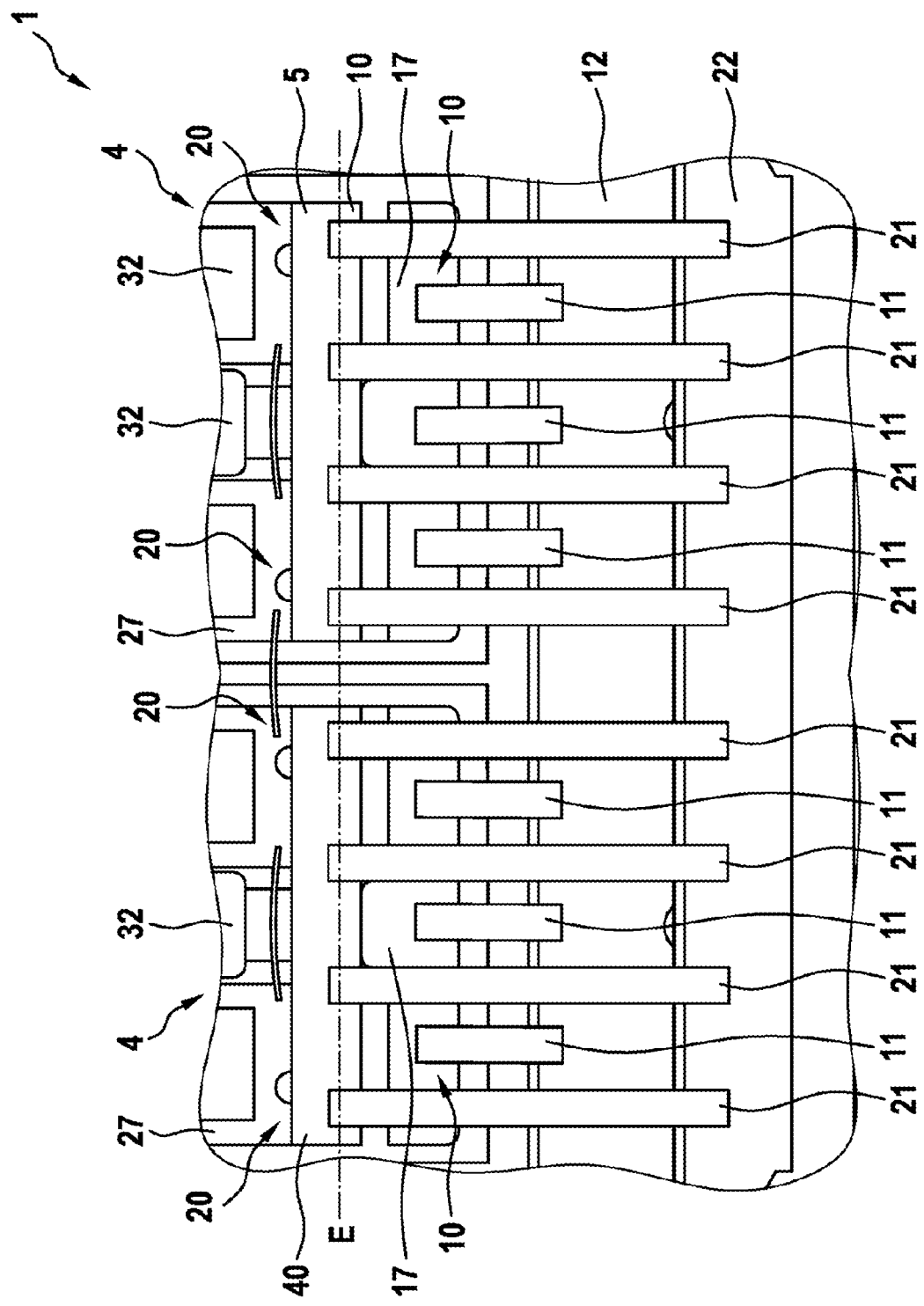
FIG. 3 shows an illustration of an exemplary embodiment of the electronic circuit unit according to the invention.

An electronic circuit unit 1 according to the invention is illustrated in FIG. 3. In this figure, the electronic circuit unit 1 comprises a bridge element 40. The bridge element 40 is produced from an electrically conductive material. The bridge element 40 is designed as a metal strip for example. The bridge element 40 electrically conductively connects the two second connection points 20, which are separated by the first connection point 10, to one another. For this purpose, the bridge element 40 is guided across the first connection point 10 and/or the first interconnect 17 in the form of a bridge. Here, the bridge element 40 is spaced apart from the first connection point 10 and the first interconnect 17 by an intermediate space which electrically insulates the bridge element 40 from the first connection point 10. The intermediate space may be empty, or an electrically insulating spacer element may be arranged in the intermediate space. As illustrated in FIG. 3, the first connection point 10 runs on the substrate top side 7 of the carrier substrate 5 beneath the bridge element 40 and between the two second connection points 20 and then widens and extends in a planar manner in a direction of extent E on the carrier substrate 5. Here, the direction of extent E runs for example parallel in relation to a connecting line between the two second connection points 20. The bridge element 40 may be fastened to the second connection points 20 for example by soldering, adhesive bonding, sintering and/or diffusion soldering.

As illustrated in FIG. 3, the first connection point 10 is electrically conductively connected to the first conductor bar 12 via a large number of first connecting elements 11. At the same time, the bridge element 40 is electrically conductively connected to the second conductor bar 22 via a large number of second connecting elements 21. Therefore, the first interconnect 17, the first connection point 10, the first connecting element 11 and the first conductor bar 12 are electrically conductively connected to one another and therefore have the same polarity T−. At the same time, the second interconnect 27, the second connection points 20, the bridge element 40, the second connecting elements 21 and the second conductor bar 22 are electrically conductively connected to one another and therefore have the same potential T+.

The connecting elements 11, 12 may be designed for example as wire bonds and/or as ribbon bonds. Three first connecting elements 11, which are designed as ribbon bonds, and four second connecting elements 21, which are also designed as ribbon bonds, are provided in this exemplary embodiment.

As illustrated in FIG. 3 the first connecting elements 11 and the second connecting elements 21 are arranged alternately here, i.e. a first connecting element 11 and a second connecting element 21 for connection purposes are arranged alternately. Therefore, connecting elements 11, 21 with opposite polarities T+, T− follow one another and the inductance of the connection between the electronics unit 4 and the electronic device 8 is reduced.

The connecting elements 11, 21 are arranged parallel in relation to one another. Therefore, for example in each case a first connecting element 11 and a second connecting element 21 may be oriented parallel in relation to one another in pairs. However, as shown in FIG. 3, all connecting elements 11, 21 may also for example be oriented parallel in relation to one another.

Each of the first connecting elements 11 has a first end at which it is connected to the first connecting point 10, and has a second end at which it is connected to the first busbar 12. In the same way, each of the second connecting elements 21 has a first end at which it is connected to the bridge element 40 and has a second end at which it is connected to the second busbar 22. The points at which the first connecting elements 11 are in electrically conductive contact with the first connection point 10 at the first end are lined up next to one another along the direction of extent E at the first connecting point 10. The points at which the first connecting elements 11 are in electrically conductive contact with the first conductor bar 12 at a second end are lined up next to one another along the longitudinal extent of the first conductor bar 12. The points at which the second connecting elements 21 are in electrically conductive contact with the bridge element 40 at the first end are lined up next to one another on the bridge element 40. The points at which the second connecting elements 21 are in electrically conductive contact with the second conductor bar 22 at the second end are lined up next to one another along the longitudinal extent of the second conductor bar 22.

It goes without saying that further exemplary embodiments and mixed forms of the exemplary embodiments illustrated are also possible.

The invention claimed is:

1. An electronic circuit unit (1) comprising: at least one electronics unit (4), wherein the electronics unit (4) comprises at least one carrier substrate (5) and at least one electrical and/or electronic component (32) arranged on the carrier substrate (5), wherein at least one first connection point (10) and at least two second connection points (20) are formed on the carrier substrate (5) on a substrate top side (7) of the carrier substrate (5), wherein the first connection point (10) is arranged between the two second connection points (20), wherein the electronic circuit unit (1) further comprises at least one electrical or electronic device (8) with at least one first conductor bar (12) for electrically contacting the electronic device (8) and at least one second conductor bar (22) for electrically contacting the electronic device (8), wherein an electrically conductive bridge element (40) electrically conductively connects the two second connection points (20) to one another, wherein the bridge element (40) is guided across the first connection point (10) in the manner of a bridge and is spaced apart and electrically insulated from said first connection point by an intermediate space, wherein the first connection point (10) is electrically conductively connected to the first conductor bar (12) by first connecting elements (11) and the second connection point (20) is electrically conductively connected to the second conductor bar (22) by second connecting elements (21).

2. The electronic circuit unit according to claim 1, wherein the first connecting elements (11) are designed as ribbon bonds and/or as wire bonds and/or the second connecting elements (21) are designed as ribbon bonds and/or as wire bonds.

3. The electronic circuit unit according to claim 1, wherein the first connecting elements (11) and the second connecting elements (21) are arranged alternately.

4. The electronic circuit unit according to claim 1, wherein the first connecting elements (11) and the second connecting elements (21) are arranged parallel in relation to one another.

5. The electronic circuit unit according to claim 1, wherein the first connection point (10) extends in a planar manner in a direction of extent (E) on the carrier substrate (5) between the two second connection points (20).

6. The electronic circuit unit according to claim 5, wherein points at which the first connecting elements (11) are in electrically conductive contact with the first connection point (10) are arranged next to one another along the direction of extent (E).

7. The electronic circuit unit according to claim 1, wherein points at which the second connecting elements (21) are electrically conductively connected to the bridge element (40) are arranged next to one another along a direction of extent of the bridge element (40).

8. The electronic circuit unit according to claim 1, wherein the first connecting elements (11) along the first conductor bar (12) are in electrically conductive contact with the first conductor bar (12) and/or the second connecting elements (21) along the second conductor bar (22) are in electrically conductive contact with the second conductor bar (22).

9. The electronic circuit unit according to claim 1, wherein the bridge element (40) is a metal strip.

10. The electronic circuit unit according to claim 1, wherein an electrically insulating spacer element is arranged in the intermediate space between the bridge element (40) and the first connection point (10).

11. The electronic circuit unit according to claim 1, wherein the circuit unit serves as an inverter for an electrical machine or as a converter.

12. The electronic circuit unit according to claim 1, wherein the electronics unit (4) is a power electronics unit.

* * * * *